US008918577B1

(12) United States Patent
Gorobets et al.

(10) Patent No.: US 8,918,577 B1
(45) Date of Patent: Dec. 23, 2014

(54) THREE DIMENSIONAL NONVOLATILE MEMORY WITH VARIABLE BLOCK CAPACITY

(71) Applicant: SanDisk Technologies Inc., Plano, TX (US)

(72) Inventors: Sergey Anatolievich Gorobets, Edinburgh (GB); Jian Chen, Menlo Park, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/304,562

(22) Filed: Jun. 13, 2014

(51) Int. Cl.
G06F 12/00 (2006.01)
G06F 3/06 (2006.01)

(52) U.S. Cl.
CPC .............. *G06F 3/0679* (2013.01); *G06F 3/064* (2013.01); *G06F 3/0604* (2013.01)
USPC ........................................................ 711/102

(58) Field of Classification Search
USPC ..................................... 711/102; 365/185.33
See application file for complete search history.

(56) References Cited

U.S. PATENT DOCUMENTS

| | | | |
|---|---|---|---|
| 5,070,032 | A | 12/1991 | Yuan et al. |
| 5,095,344 | A | 3/1992 | Harari |
| 5,313,421 | A | 5/1994 | Guterman et al. |
| 5,315,541 | A | 5/1994 | Harari et al. |
| 5,343,063 | A | 8/1994 | Yuan et al. |
| 5,570,315 | A | 10/1996 | Tanaka et al. |
| 5,661,053 | A | 8/1997 | Yuan |
| 5,768,192 | A | 6/1998 | Eitan |
| 5,903,495 | A | 5/1999 | Takeuchi et al. |
| 6,011,725 | A | 1/2000 | Eitan |
| 6,046,935 | A | 4/2000 | Takeuchi et al. |
| 6,222,762 | B1 | 4/2001 | Guterman et al. |
| 7,518,919 | B2 | 4/2009 | Gonzalez et al. |
| 7,839,685 | B2 | 11/2010 | Auclair et al. |
| 8,301,912 | B2 | 10/2012 | Lin et al. |
| 8,472,257 | B2 | 6/2013 | Dong et al. |
| 2005/0122779 | A1 | 6/2005 | Fasoli et al. |
| 2007/0263439 | A1 | 11/2007 | Cornwell et al. |
| 2008/0288814 | A1 | 11/2008 | Kitahara |
| 2008/0294949 | A1 | 11/2008 | Sugahara |

(Continued)

FOREIGN PATENT DOCUMENTS

| | | |
|---|---|---|
| WO | WO 2009088920 | 7/2009 |
| WO | WO 2010030701 | 3/2010 |

(Continued)

OTHER PUBLICATIONS

U.S. Appl. No. 13/940,504 entitled Efficient Smart Verify Method for Programming 3D Non-Volatile Memory, filed Jun. 12, 2013, 49 pages.

(Continued)

*Primary Examiner* — Aimee Li
*Assistant Examiner* — Craig Goldschmidt
(74) *Attorney, Agent, or Firm* — Davis Wright Tremaine LLP

(57) ABSTRACT

In a three-dimensional nonvolatile memory, physical levels in blocks are zoned and different zones store different numbers of bits per cell so that different blocks have different data capacities. Block data capacities are calculated and recorded, and may be updated as data capacities change. User data is mapped to blocks according to their respective data capacities.

23 Claims, 15 Drawing Sheets

(56) References Cited

U.S. PATENT DOCUMENTS

| | | |
|---|---|---|
| 2009/0168533 A1 | 7/2009 | Park et al. |
| 2009/0204824 A1 | 8/2009 | Lin et al. |
| 2009/0268524 A1 | 10/2009 | Maejima |
| 2009/0323942 A1 | 12/2009 | Sharon et al. |
| 2010/0070682 A1 | 3/2010 | Wan et al. |
| 2010/0322000 A1 | 12/2010 | Shim et al. |
| 2011/0032759 A1 | 2/2011 | Kim et al. |
| 2011/0038203 A1 | 2/2011 | Camp et al. |
| 2011/0119431 A1 | 5/2011 | Chowdhury |
| 2011/0161784 A1 | 6/2011 | Selinger et al. |
| 2012/0051137 A1 | 3/2012 | Hung et al. |
| 2012/0166708 A1 | 6/2012 | Chung et al. |
| 2012/0166714 A1 | 6/2012 | Mun et al. |
| 2012/0220088 A1 | 8/2012 | Alsmeier |
| 2012/0239861 A1 | 9/2012 | Lee et al. |
| 2012/0254574 A1* | 10/2012 | Sinclair et al. ............ 711/165 |
| 2012/0268988 A1 | 10/2012 | Seol et al. |
| 2012/0272017 A1 | 10/2012 | Lee et al. |
| 2012/0284589 A1 | 11/2012 | Kim et al. |
| 2012/0297111 A1 | 11/2012 | Hsu et al. |
| 2013/0107628 A1 | 5/2013 | Dong et al. |
| 2013/0145085 A1* | 6/2013 | Yu et al. .................... 711/103 |
| 2013/0201760 A1 | 8/2013 | Dong et al. |

FOREIGN PATENT DOCUMENTS

| | | |
|---|---|---|
| WO | WO 2011019600 | 2/2011 |
| WO | WO 2011019602 | 2/2011 |
| WO | WO 2012023102 | 2/2012 |

OTHER PUBLICATIONS

U.S. Appl. No. 14/025,160 entitled "Vread Bias Allocation on Word Lines for Read Disturb Reduction in 3D Non-Volatile Memory," filed Sep. 12, 2013, 54 pages.

Eitan et al., "NROM: A Novel Localized Trapping, 2-Bit Nonvolatile Memory Cell," IEEE Electron Device Letters, vol. 21, No. 11, Nov. 2000, pp. 543-545.

U.S. Appl. No. 13/801,741 entitled "Weighted Read Scrub for Non-volatile Memory," filed Mar. 3, 2013, 45 pages.

U.S. Appl. No. 13/791,200 entitled "Optimized Configurable NAND Parameters," filed Mar. 8, 2013, 37 pages.

U.S. Appl. No. 61/731,198, filed Nov. 29, 2012, 32 pages.

U.S. Appl. No. 61/731,215, filed Nov. 29, 2012, 42 pages.

U.S. Appl. No. 14/064,823, filed Oct. 28, 2013, 48 pages.

U.S. Appl. No. 14/064,887, filed Oct. 28, 2013, 42 pages.

U.S. Appl. No. 13/908,905, filed Jun. 13, 2013, 48 pages.

Office Action for U.S. Appl. No. 14/304,567 mailed Aug. 28, 2014, 30 pages.

\* cited by examiner

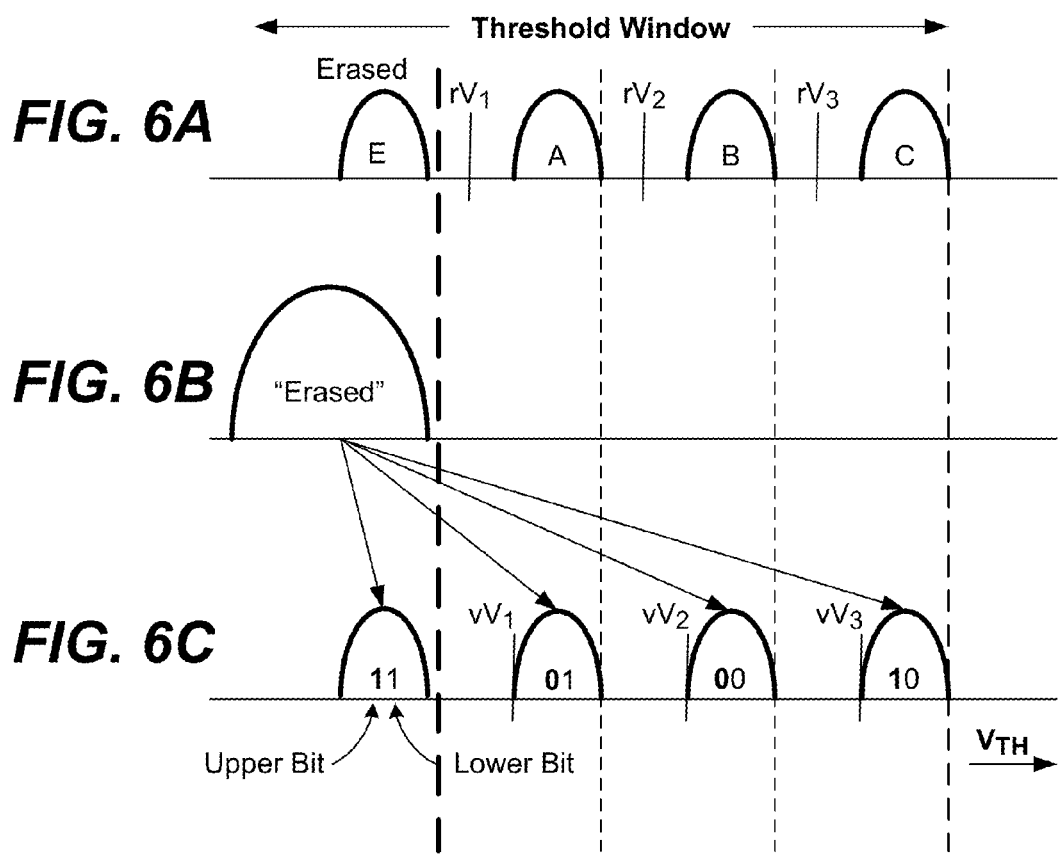
Programming into four states represented by a 2-bit code

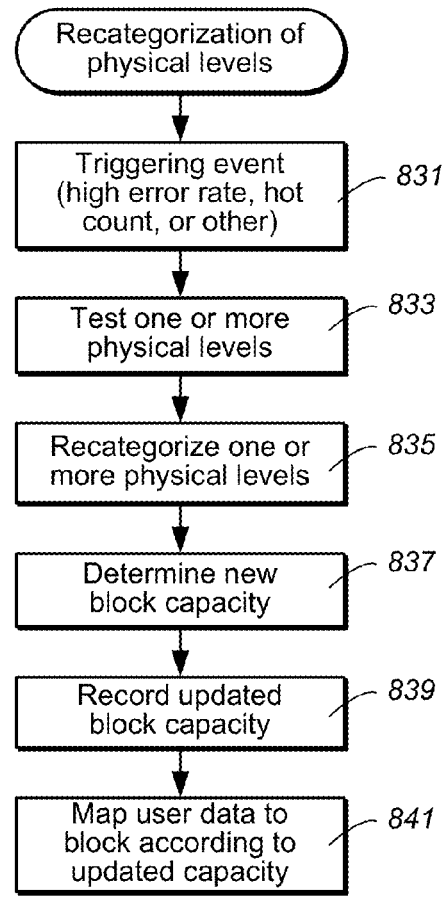
FIG. 16
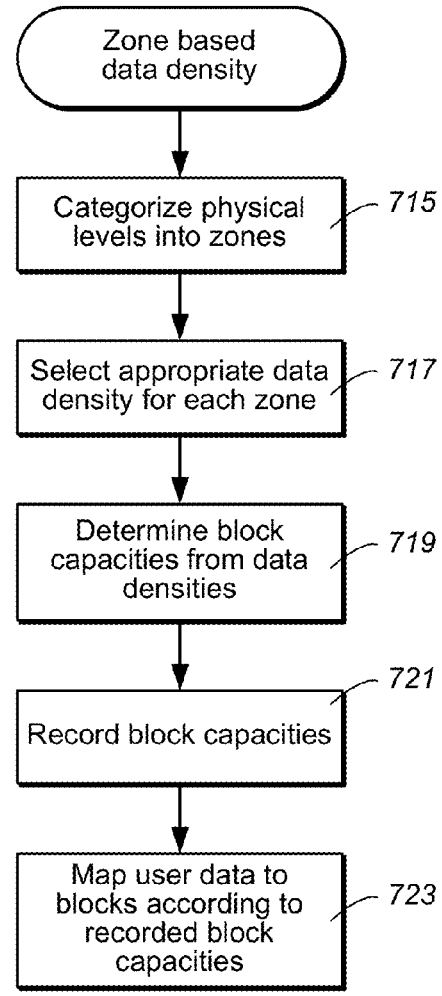
FIG. 17
FIG. 18

THREE DIMENSIONAL NONVOLATILE MEMORY WITH VARIABLE BLOCK CAPACITY

CROSS-REFERENCE TO RELATED APPLICATION

This application is related to U.S. Patent Application entitled, "Adaptive Storage Density in Three Dimensional Nonvolatile Memory Blocks" filed on the same day as the present application, which is hereby incorporated by reference in its entirety.

BACKGROUND

This application relates to the operation of re-programmable nonvolatile three dimensional memory such as semiconductor flash memory.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In addition to flash memory, other forms of nonvolatile memory may be used in nonvolatile memory systems. For example Ferroelectric RAM (FeRAM, or FRAM) uses a ferroelectric layer to record data bits by applying an electric field that orients the atoms in a particular area with an orientation that indicates whether a "1" or a "0" is stored. Magnetoresistive RAM (MRAM) uses magnetic storage elements to store data bits. Phase-Change memory (PCME, or PRAM) such as Ovonic Unified Memory (OUM) uses phase changes in certain materials to record data bits. Resistive RAM (ReRAM) uses changes in electrical resistance of certain materials to record data. Various other nonvolatile memories are also in use or proposed for use in nonvolatile memory systems.

Many nonvolatile memories are formed along a surface of a substrate (e.g. silicon substrate) as two dimensional (2D), or planar, memories. Other nonvolatile memories are monolithically formed in one or more physical levels of memory cells having active areas disposed above a substrate.

SUMMARY OF THE INVENTION

In some three-dimensional nonvolatile memory systems, physical levels of memory cells in a block are categorized into zones. Data is programmed with different data densities in different zones (i.e. different numbers of bits per cell). Zones that include physical levels with better characteristics (e.g. lower error rates, better signal to noise ratios) store more bits per cell than zones with worse characteristics. Thus, overall capacity of the block is efficiently utilized. As blocks age, or as different programming schemes, reading schemes, ECC schemes, or other memory operations change, data densities may be modified and physical levels may be recategorized to efficiently use available capacity. Thus, data capacities vary from block-to-block and over time. Block capacities are calculated from the different data densities in the blocks and are recorded in a table or other structure for use when mapping user data to blocks.

An example of a method of operating a three-dimensional nonvolatile memory system in which an individual memory die is monolithically formed in a plurality of physical levels of memory cells disposed above a substrate includes: configuring a plurality of blocks in the three-dimensional nonvolatile memory so that, in an individual block of the plurality of blocks, memory cells in a first category of physical levels store a first number of bits per cell and memory cells in a second category of physical levels store a second number of bits per cell, the second number being greater than the first number; recording data capacity values for the plurality of blocks based on the numbers of physical levels in the first and second categories in the blocks; and subsequently, mapping portions of user data to the plurality of blocks according to data capacities of the blocks.

The plurality of blocks may have different data capacities and a separate data capacity value may be recorded for each of the plurality of blocks. At least one block of the plurality of blocks may subsequently be reconfigured so that at least one physical level in the at least one block is recategorized between first and second categories and the number of bits per cell stored in the at least one physical level is changed. The reconfiguring may include recategorizing at least one physical level in the at least one block that previously stored at least one bit per cell as a bad physical level that is not for subsequent storage of user data. A new data capacity value may be recorded for the at least one block, the new data capacity reflecting the changed number of bits per cell stored in the at least one physical level of the block, and subsequently mapping user data to the at least one block according to the new data capacity. The at least one physical level may be recategorized from the second category to the first category thereby reducing the number of bits per cell stored in the at least one physical level resulting in the new data capacity value for the at least one block being less than a previous data capacity value for the at least one block, and subsequent to the reconfiguring less user data may be mapped to the at least one block than was mapped to the at least one block prior to the reconfiguring. The reconfiguring may occur in response to at least one of: a number of write erase cycles experienced by the at least one block exceeding a threshold number, or an error rate of data read from the at least one block exceeding a threshold number. The first number of bits per cell may be one and the second number of bits per cell may be two, or the first number of bits per cell may be two and the second number of bits per cell may be three. Memory cells of a third category of physical levels in the individual block may store a third number of bits per cell, and the recorded data capacity value for the blocks may be based on the numbers of physical levels in the first, second, and third categories. The first number of bits per cell may be one, the second number of bits per cell may be two, and the third number of bits per cell may be three. Memory cells of a third category of physical levels in the individual block may be configured to store no user data.

An example of a three-dimensional nonvolatile memory system includes: a three-dimensional nonvolatile memory that is monolithically formed in a plurality of physical levels of memory cells disposed above a substrate; a plurality of individually erasable blocks in the three-dimensional nonvolatile memory, each of the plurality of individually erasable blocks extending through the plurality of physical levels; a write circuit that is configured to write data along word lines of a first category of physical levels of an individual block by writing a first number of bits per cell and to write data along word lines of second category of physical levels of the individual block by writing a second number of bits per cell, the second number being greater than the first number; a block capacity record that records block data capacities of the plurality of individually erasable blocks; and a logical to physical mapping circuit that maps portions of user data to the plurality of individually erasable blocks according to their recorded capacities.

Different blocks of the plurality of blocks may have different data capacities and the block capacity record may contain an entry for each of the plurality of blocks. The write circuit may be located on the substrate, and the block capacity record and the logical to physical mapping circuit may be located in a memory controller on a separate substrate. The memory controller may be connected to the three-dimensional nonvolatile memory and the memory controller may be connected to additional three-dimensional nonvolatile memories that are disposed above additional substrates. The block capacity record may record capacities of individually erasable blocks in the additional three-dimensional nonvolatile memories and the logical to physical mapping circuit may map portions of user data to the individually erasable blocks in the additional three-dimensional nonvolatile memories according to their recorded capacities. A recategorization circuit may be located in the memory controller, the recategorization circuit configured to recategorize physical levels between the first and second categories in the plurality of individually erasable blocks in the three-dimensional nonvolatile memory and the individually erasable blocks in the additional three-dimensional nonvolatile memories, thereby changing corresponding block data capacities. An Error Correction Code (ECC) circuit may be in communication with the recategorization circuit, the ECC circuit configured to determine a number of bad bits in a portion of data in an individual block, the recategorization circuit configured to recategorize physical levels of the individual block in response to the number of bad bits in the portion of data exceeding a threshold number. The first number of bits per cell may be one and the second number of bits per cell may be two, or the first number of bits per cell may be two and the second number of bits per cell may be three. The write circuit may be further configured to write data along word lines of a third category of physical levels of the individual block by writing a third number of bits per cell, and the recorded block data capacities for the blocks may be based on the numbers of physical levels in the first, second, and third categories in corresponding blocks. The first number of bits per cell may be one, the second number of bits per cell may be two, and the third number of bits per cell may be three.

An example of a method of operating a three-dimensional nonvolatile memory system in which an individual memory die is monolithically formed in a plurality of physical levels of memory cells disposed above a substrate includes: configuring a plurality of blocks in the three-dimensional nonvolatile memory so that, in an individual block of the plurality of blocks, memory cells in a first category of physical levels store a first number of bits per cell and memory cells in a second category of physical levels store a second number of bits per cell, the second number being greater than the first number; recording individual data capacity values for each of the plurality of blocks based on the numbers of physical levels in the first and second categories in the blocks; subsequently, mapping portions of user data to the plurality of blocks according to individual data capacity values of the blocks; subsequently reconfiguring at least one block of the plurality of blocks so that at least one physical level in the at least one block is recategorized between first and second categories and the number of bits per cell stored in the at least one physical level is changed; recording a new data capacity value for the at least one block, the new data capacity value reflecting the changed number of bits per cell stored in the at least one physical level of the block; and subsequently mapping portions of user data to the at least one block according to the new data capacity value.

An example of a three-dimensional nonvolatile memory system includes: a three-dimensional nonvolatile memory that is monolithically formed in a plurality of physical levels of memory cells disposed above a substrate; a plurality of individually erasable blocks in the three-dimensional nonvolatile memory, each of the plurality of individually erasable blocks extending through the plurality of physical levels; a write circuit that is configured to write data along word lines of a first category of physical levels of an individual block by writing a first number of bits per cell and to write data along word lines of second category of physical levels of the individual block by writing a second number of bits per cell, the second number being greater than the first number; a block capacity record that records individual block data capacity values for each of the plurality of individually erasable blocks; a logical to physical mapping circuit that maps portions of user data to the plurality of individually erasable blocks according to their recorded capacities; and a recategorization circuit located in the memory controller, the recategorization circuit configured to recategorize physical levels between the first and second categories in the plurality of individually erasable blocks in the three-dimensional non-volatile memory thereby changing corresponding block data capacities of the plurality of individually erasable blocks.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6C illustrate an example of programming a population of memory cells.

FIG. 16 shows a table that stores block data capacities for blocks in a memory.

FIG. 17 illustrates a zone based variable data density scheme.

FIG. 18 illustrates recategorization of physical levels.

DETAILED DESCRIPTION

Memory System

Figure 1:
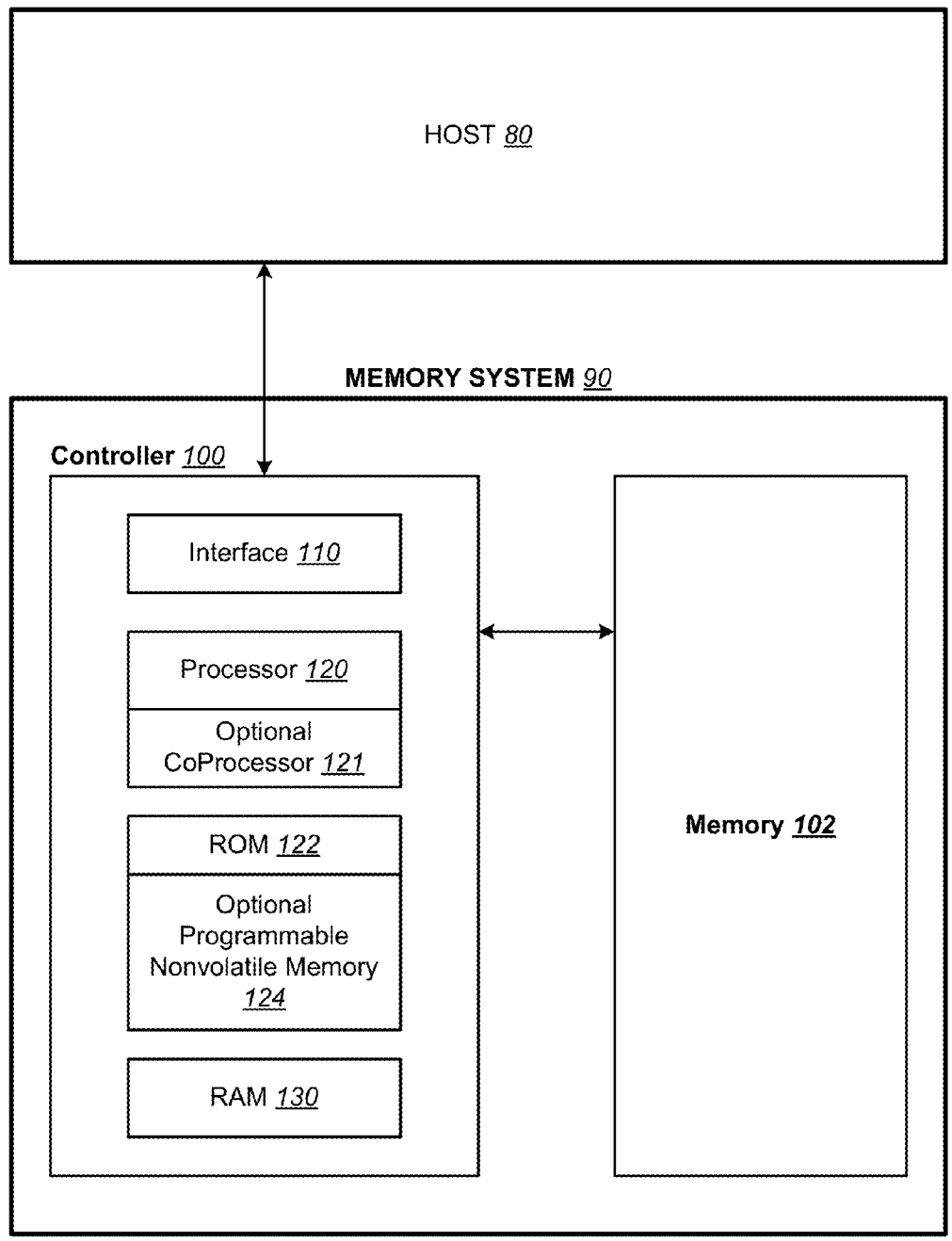
FIG. 1 illustrates schematically the main hardware components of a memory system suitable for implementing the present invention.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

FIG. 1 illustrates schematically the main hardware components of a memory system suitable for implementing the present invention. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Physical Memory Structure

Figure 2:
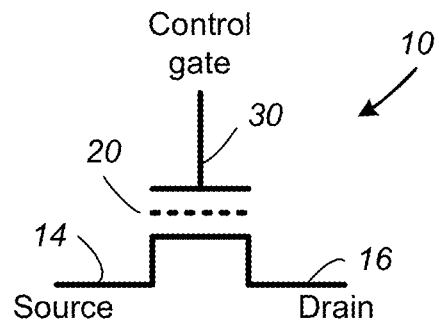
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
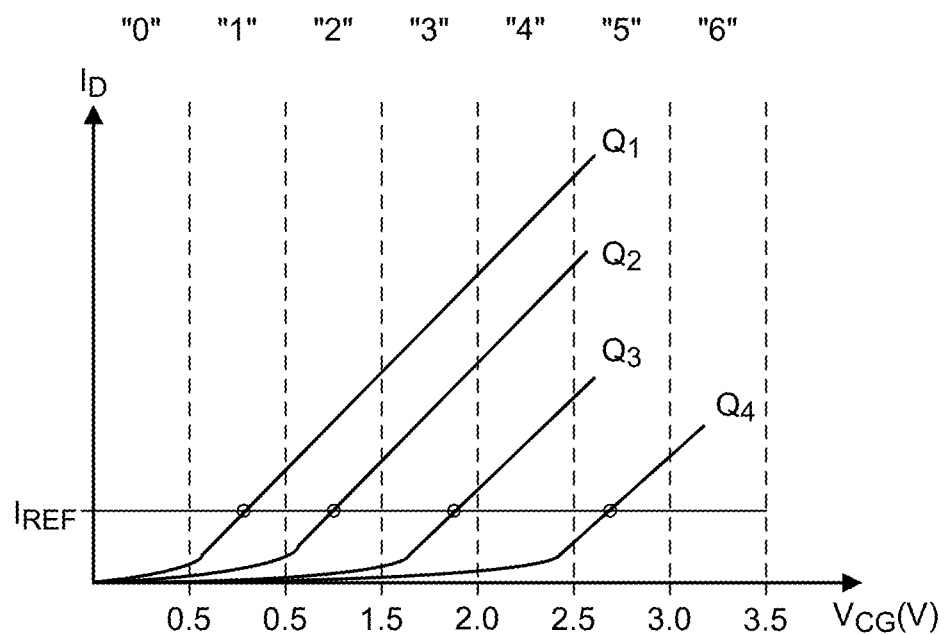
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG 0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
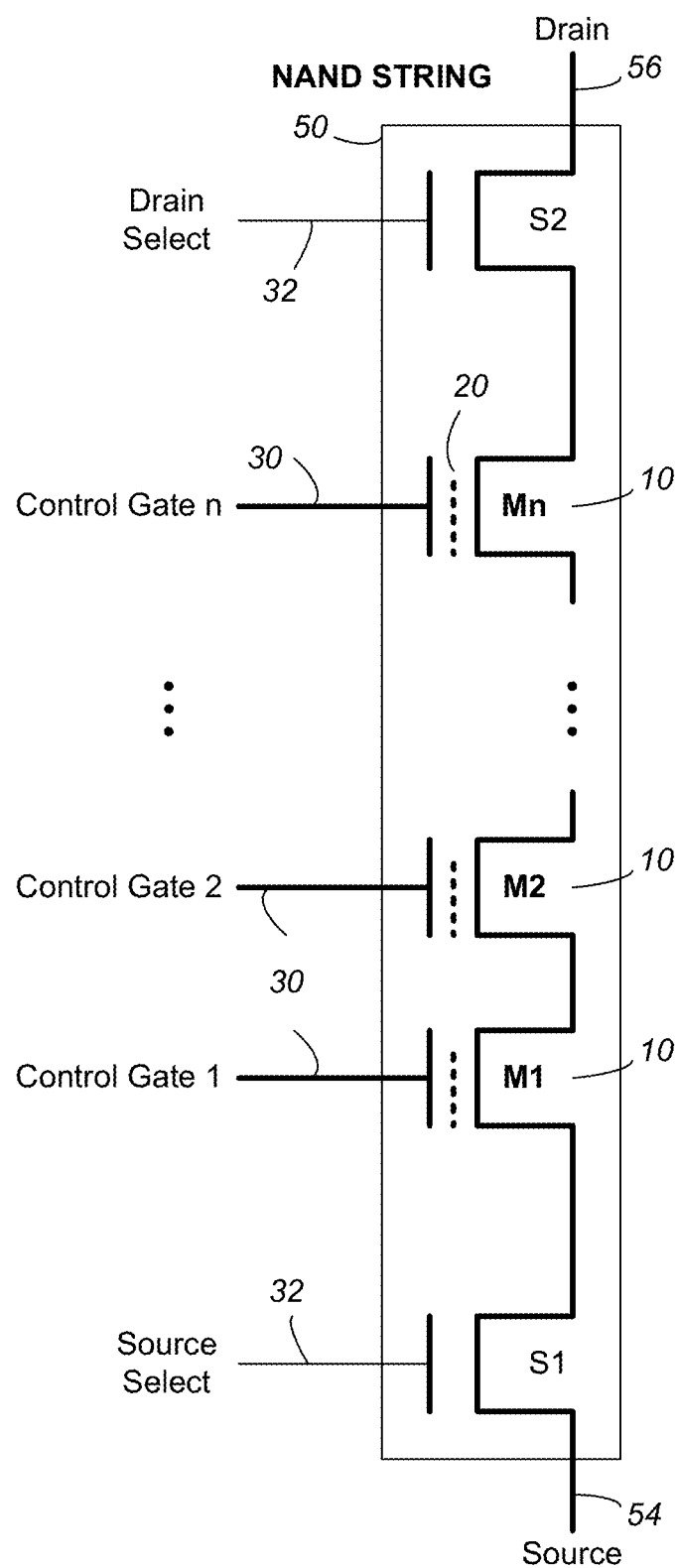
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
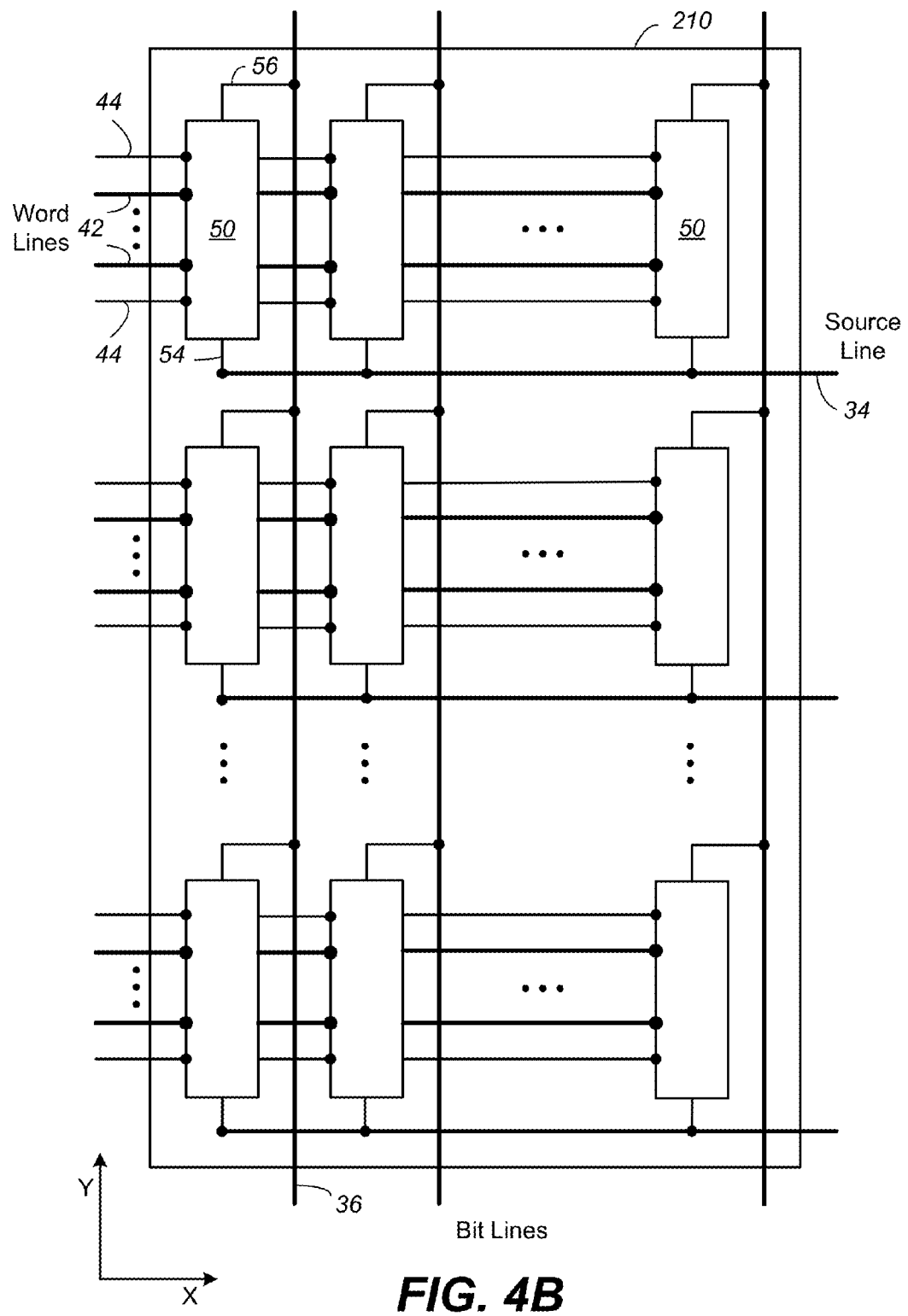
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
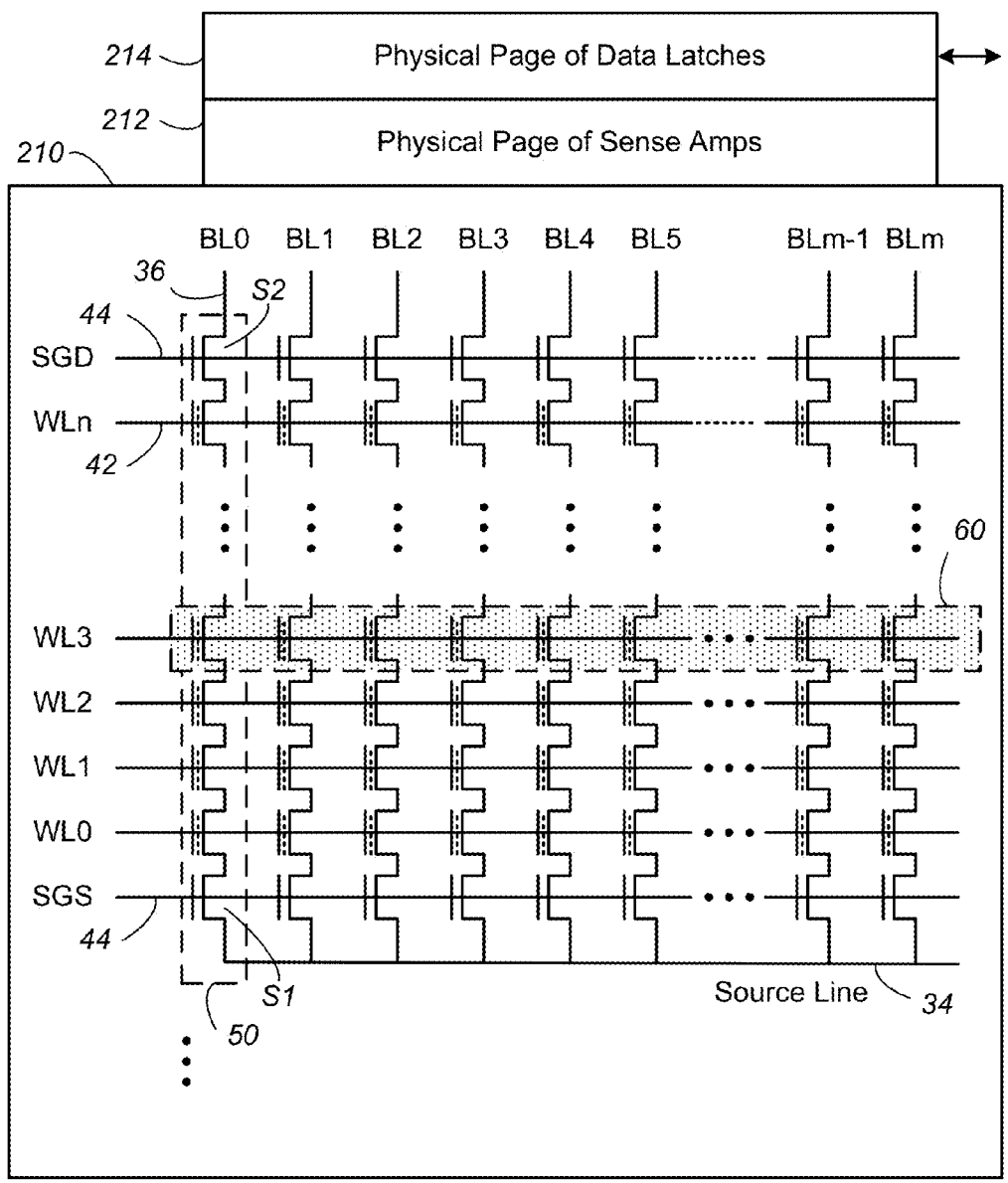
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

Figure 7:
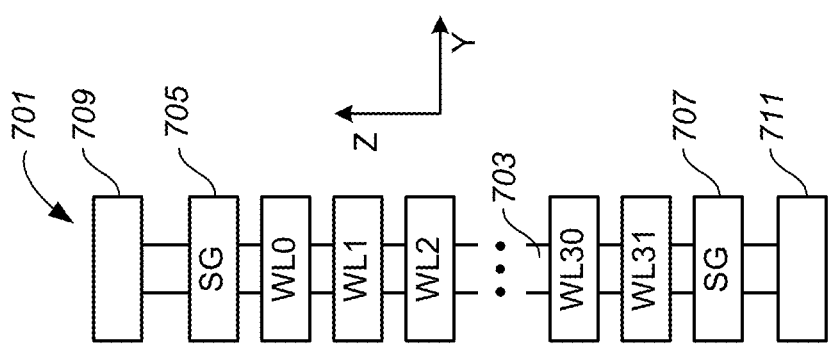
FIG. 7 shows an example of a physical structure of a 3-D NAND string.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

Figure 8:
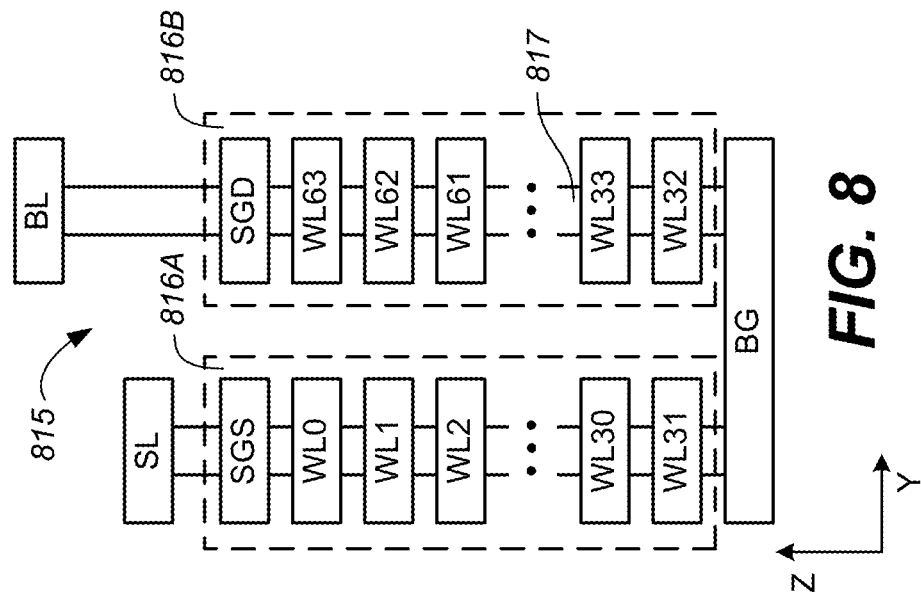
FIG. 8 shows an example of a physical structure of a U-shaped 3-D NAND string.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9A:
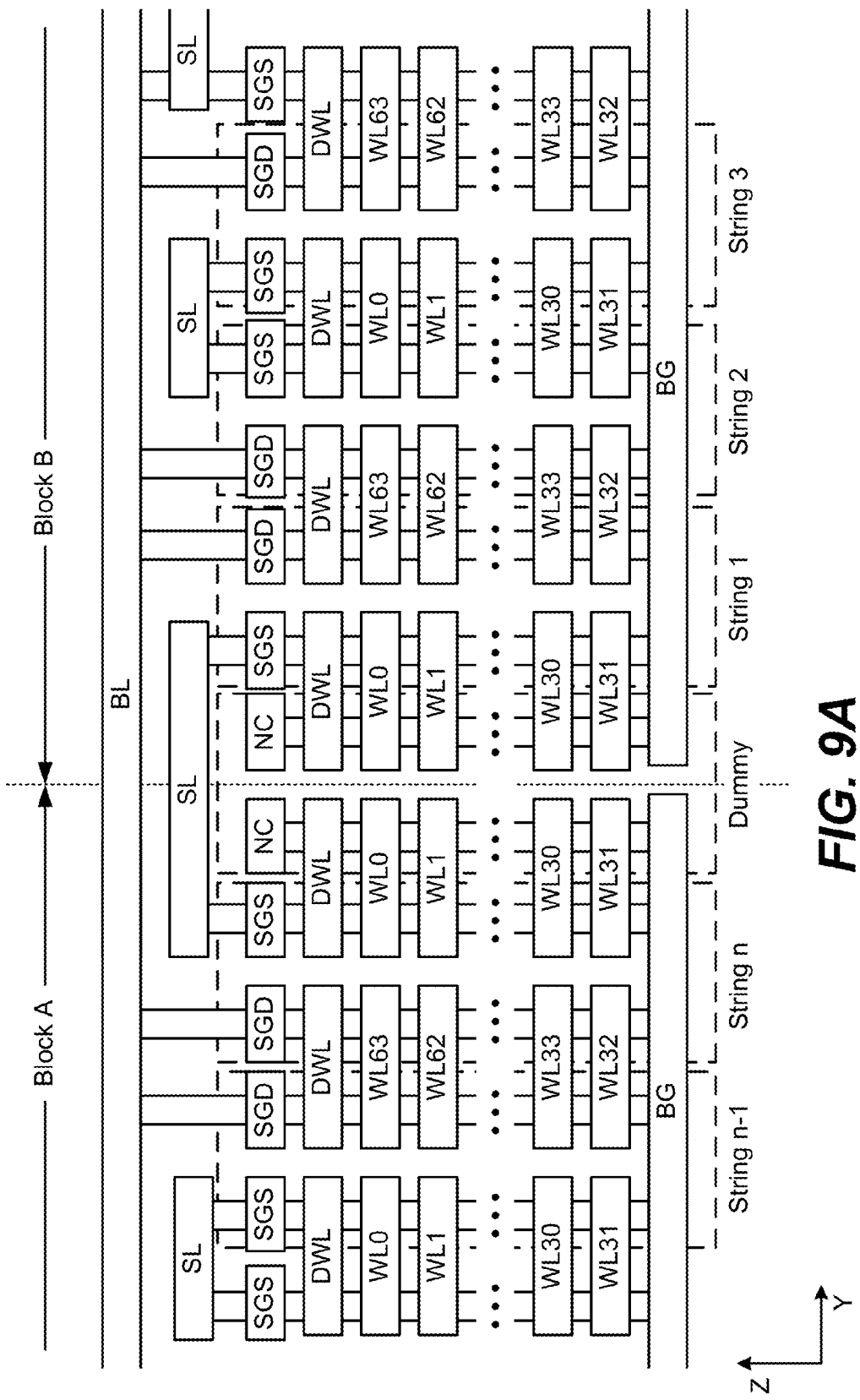
FIG. 9A shows a cross section of a 3-D NAND memory array with U-shaped NAND strings in the y-z plane.

Vertical NAND strings may be arranged to form a 3-D NAND array in various ways. FIG. 9A shows an example where multiple U-shaped NAND strings in a block are connected to a bit line. In this case, there are n strings (String 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

FIG. 9A shows where two blocks meet. Block A contains n strings connected to the bit line BL. While only strings n, and n−1 of Block A are shown, it will be understood that the repetitive structure continues to the left where strings 1 to n−2 are located. Block B contains n strings connected to bit line BL. While only strings 1-3 of Block B are shown, it will be understood that the repetitive structure continues to the right where strings 4 to n are located. It will also be understood that the cross section shown is along one of many bit lines that serve the block and that there are many similar bit lines extending along the y-direction, separated from each other in the x-direction (e.g. behind the plane of the cross section shown). Word lines extend in the x-direction, perpendicular to the plane of FIG. 9A, to connect sets of strings of different bit lines. Similarly, select lines extend in the x-direction so that a set of strings may be selectively connected, or isolated, as a unit. In the example shown, word lines are formed so that a single conductive strip forms a word line of two adjacent strings. Thus, for example, in Block B, string 1 and string 2 have word lines WL32-WL63 that are formed by common conductive strips. In contrast, select lines are not shared between neighboring strings. This allows separate selection of an individual set of strings within a block, even though the selected set of strings may include word lines that are not separately controllable from word lines of unselected strings.

FIG. 9A shows dummy word lines "DWL" separating select lines SGD, SGS, from host data word lines WL0-WL63. While host data word lines are used to store host data (i.e. data that may be sent to the memory from an external source with the expectation that the data will be returned in response to a read command), dummy word lines do not store host data. They may store nothing, or may store some dummy data that puts the dummy cells in a desirable condition (e.g. puts their threshold voltages at levels that make accessing other cells easier, or reduces risk of disturbance). The dummy word lines shown provide some protection for stored data.

Each block has a separate back gate, BG, so that back gate transistors of different blocks may be separately controlled. Back gates extend in the x-direction, perpendicular to the cross section of FIG. 9A, so that all back gate transistors of a block are controlled by a common back gate in this example.

Control circuits are connected to the back gates of each block so that appropriate bias may be applied to back gates.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 9B:
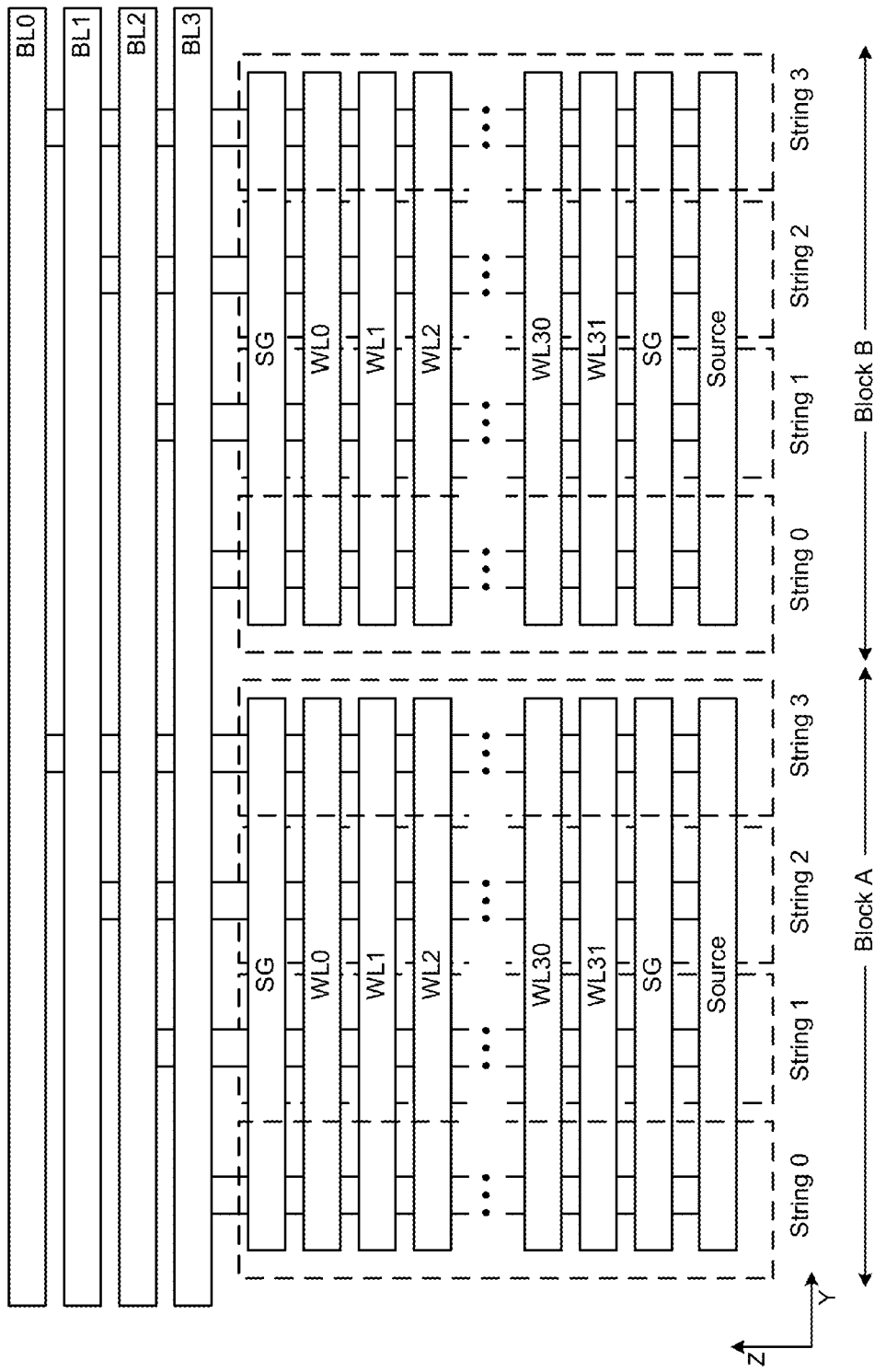
FIG. 9B shows a cross section of a 3-D NAND memory with straight NAND strings in the y-z plane.

FIG. 9B shows a memory structure in which straight vertical NAND strings extend from common source connections in or near a substrate to global bit lines (BL0-BL3) that extend over the physical levels of memory cells. Word lines in a given physical level in a block are formed from a sheet of conductive material. Thus, WL0 of each string in a block is formed from the same portion of conductive material. Memory hole structures extend down through these sheets of conductive material to form memory cells.

Figures 10A, 10B:
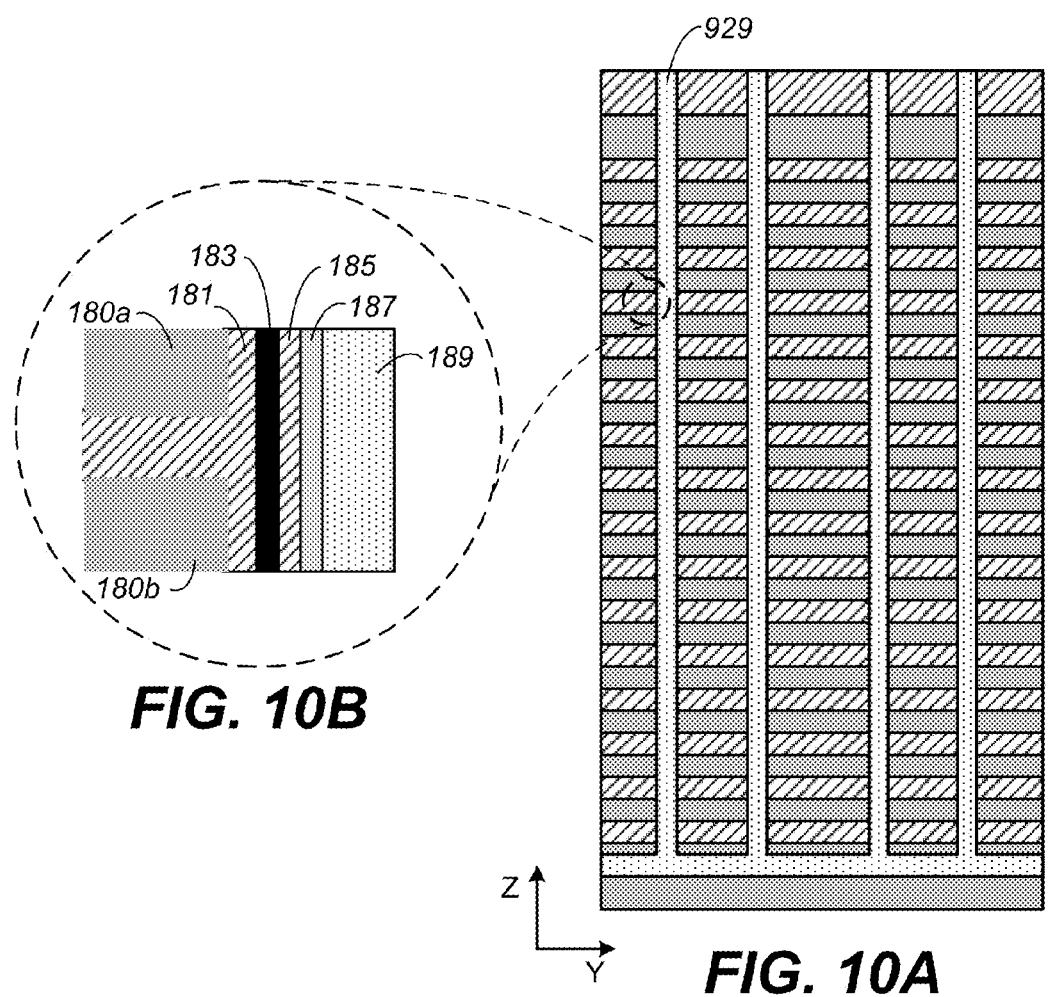
FIGS. 10A-10B shows an example of a memory hole structure.

FIG. 10A shows a cross section along a y-z plane that intersects memory holes including memory hole 929 so that the structures formed within memory holes (memory hole structures) may be clearly seen. FIG. 10A shows that memory holes are connected together at the bottom by a common source connection. In other examples, back gates or other structures may be provided in or on a substrate at this location.

FIG. 10B shows the structure of a stack of layers in the memory hole 929 where memory cells are formed (the memory hole structure). It can be seen that a blocking dielectric "Block" 181 is deposited on the walls of the memory hole to provide electrical isolation from word lines 180a, 180b. A Charge Trapping Layer (CTL) 183 is deposited on the blocking dielectric 181. The CTL layer 183 forms charge storage elements where the CTL is in close proximity to polysilicon word lines 180a, 180b. A tunnel dielectric 185 is deposited to provide electrical isolation and to allow charge to tunnel into the CTL layer 183 under certain conditions. A channel layer 187 is deposited to form the channel of the memory cells along the string. A core material 189 is deposited that forms the core of the column that is located in the memory hole.

The memory hole structure of FIG. 10B may be found in memory holes of various vertical NAND strings including U-shaped and straight NAND strings. Different memory designs use different arrangements of bit lines, source lines, and select lines to access memory cells. Aspects of the present invention may be applied to various memory designs that have some variation in memory cells between physical levels due to memory hole geometry or otherwise.

One difference between a three dimensional memory array and a two dimensional memory array is that certain physical dimensions of memory cells may vary with the location of the memory cells in the vertical direction. While memory cells in a planar array may be made by process steps that generally have uniform effect across the plane of the substrate, some steps in formation of three dimensional memory arrays are not uniform from physical level to physical level and may also have significant non-uniformity laterally across a substrate. For example, memory holes may be formed by etching down through multiple layers using an appropriate anisotropic etch. However, such holes may not be perfectly uniform from top to bottom because of the high aspect ratio that is typical of such memory holes. In general, such memory holes are wider towards the top than the bottom. Or, they may be widest somewhere near the top with some narrowing towards the top. Also, while memory holes may be relatively uniform in shape and position at the top (close to the masking layer that defines them) they may become less uniform lower down. For example, memory holes may be uniformly circular in cross section with the same diameter at the top but may deviate from a circular shape (becoming oval or otherwise distorted from circular) at lower levels and may show significant variation from memory hole to memory hole.

Figures 11A, 11B, 11C:
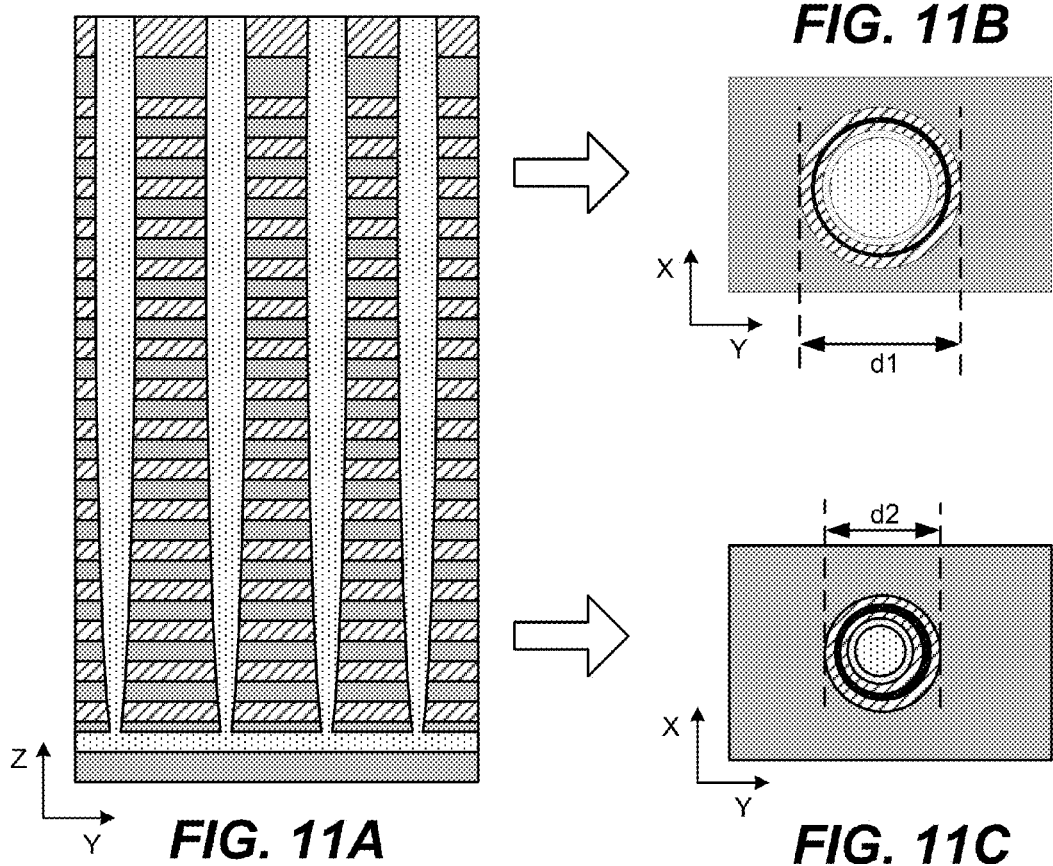
FIG. 11A shows variation in memory hole diameter in a memory hole structure.
FIG. 11B shows a cross section of a memory hole in an upper level.
FIG. 11C shows a cross section of a memory hole in a lower level.

FIG. 11A shows an example of how memory hole diameter may vary with vertical distance from the substrate. Memory holes are narrower towards the bottom of the memory hole compared with the top of the memory hole. FIG. 11B shows a cross section of a memory hole having a relatively large diameter, d1, for example near the top of a memory hole (relatively far from the substrate). FIG. 11C shows a cross section of a memory hole having a relatively small diameter, d2, for example near the bottom of a memory hole (relatively near the substrate). Diameter d2 is significantly less than diameter d1 which leads to a significantly stronger electric field within the memory hole of FIG. 11C compared with FIG. 11B under the same conditions (e.g. when the same voltage applied to the word line). A higher electric field affects the characteristics of memory cells. For example, programming and erase may be faster for a smaller diameter memory hole under the same conditions. Higher electric field strength may also cause increased wear and earlier failure of memory cells with small memory hole diameters. In addition to memory hole diameter, the various layers that are deposited in memory holes to form memory hole structures may vary with distance from the substrate because of different process conditions experienced at the bottoms and tops of such high aspect ratio memory holes.

Knowledge of memory hole diameters at different locations may allow memory operation at those locations to be adapted according to the expected characteristics. U.S. patent application Ser. No. 13/791,200, filed on Mar. 8, 2013, entitled, "Optimized configurable NAND parameters," and corresponding U.S. Provisional Application No. 61/731,198, filed on Nov. 29, 2012, which are hereby incorporated by reference in their entirety, describe predicted memory hole variation and how it may be used to select appropriate parameters for different levels. U.S. patent application Ser. No. 13/801,741, filed on Mar. 13, 2013, entitled, "Weighted read scrub for nonvolatile memory," and corresponding Provisional Application No. 61/731,215, filed on Nov. 29, 2012, which are hereby incorporated by reference in their entirety, describe prioritizing scrubbing of data according to predicted memory hole size.

Memory hole diameter as a function of location is somewhat predictable because etch chemistry tends to produce larger diameters near the top of an etched memory hole than near the bottom. However, this predictability is limited and there may be significant variation from one memory hole to another. Different dies formed in the same wafer may have memory holes with different profiles. For example, dies near the edge of a wafer may have different memory hole profiles than dies near the center of a wafer. Even within a single die, there may be significant variation from block to block and within blocks. U.S. patent application Ser. No. 14/064,823, filed on Oct. 28, 2013, entitled, "Block structure profiling in three dimensional memory," which is hereby incorporated by reference in its entirety, describes examples of characterizing memory hole structures at different physical levels.

In general, narrowing of memory holes and memory hole variation in lower physical levels of a three dimensional non-volatile memory may result in more bad bits occurring in data that is stored along word lines that are in lower physical levels compared with similar data that is stored along word lines that are in higher physical levels. This may mean that there is a high risk of data in lower physical levels becoming uncorrectable by ECC compared with data in higher physical levels that is similarly programmed. U.S. patent application Ser. No. 14/064,887, filed on Oct. 28, 2013, entitled, "Selection of data for redundancy calculation by likely error rate," which is hereby incorporated by reference in its entirety describes examples of redundancy schemes for use in three dimensional nonvolatile memories in which different physical levels have different likely error rates.

Adaptive Data Density

In general, error rates are higher when more bits are stored per cell in a memory. This may be because of the increased sensitivity to disturbance as memory cells are programmed to a larger number of states. For example, MLC storage generally produces more errors (higher Bit Error Rate, or "BER") than SLC storage in the same memory cells. Data stored as 3-bit per cell data will generally produce more errors than data that is stored as 2-bit per cell data in the same memory cells. In some memory systems, certain blocks are maintained as SLC blocks that have higher reliability while other blocks are maintained as MLC blocks that have higher data density.

Figure 12:
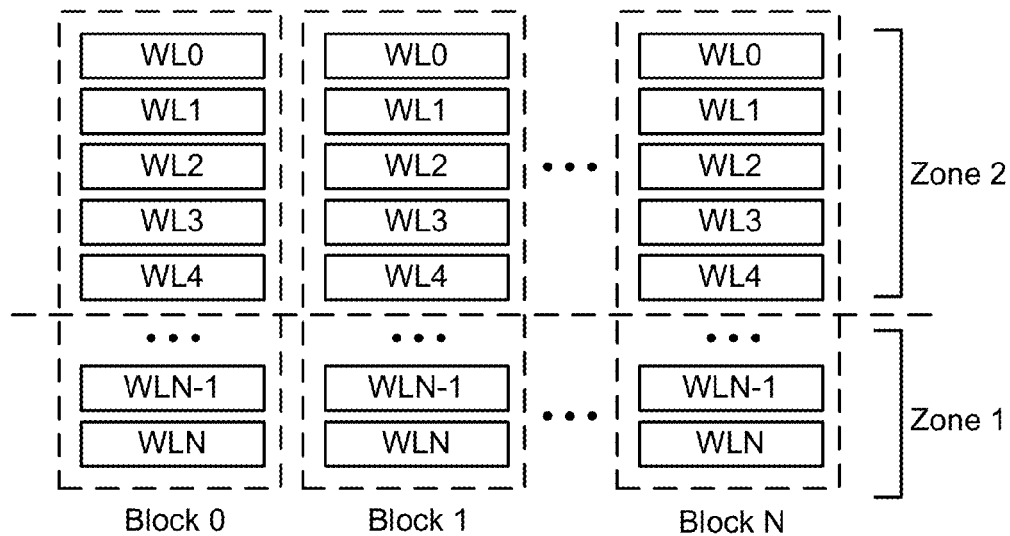
FIG. 12 shows an example of categorization of physical levels into two zones.

According to an embodiment shown in FIG. 12, different data densities may be used within the same block in a three dimensional nonvolatile memory. In particular, FIG. 12 shows N blocks in which physical levels are categorized into two zones, zone 1 and zone 2. Zone 1 includes lower physical levels (closer to the substrate) that may have smaller and less uniform memory holes and therefore a higher risk of bad bits. Zone 2 includes higher physical levels that may have larger and more uniform memory holes and therefore a lower risk of bad bits. Data density is different from zone 1 to zone 2. For example, zone 1 may store one bit per cell (SLC) while zone 2 may store two or more bits per cell (MLC) so that the block operates as a hybrid block that is partially SLC and partly MLC. Alternatively, zone 1 may contain data in an MLC format that stores n bits per cell while zone 2 may contain data in an MLC format that stores more than n bits per cell (e.g. n+1, n+2, etc.).

Categorization of physical levels into different categories that store data with different densities may be based on estimated error rates. For example, if the estimated error rate for data stored n-bits per cell in a particular physical level exceeds a threshold and the estimated error rate for data stored n−1-bits per cell in the physical level is below the threshold then the physical level may be categorized as suitable for storing n−1-bits per cell. The threshold in this example may depend on the capacity of ECC to correct errors and/or other factors. In general, it is desirable to store as many bits per cell as can be reliably stored.

Estimated error rates for different physical levels may be based on testing of data in different physical levels. This may be performed on certain test dies and then applied to similar dies, or may be performed on test blocks in each die so that categorization is done on a die-by-die basis. In a die, certain sample blocks may be tested and results from sample blocks may then be used to categorize levels in all blocks, or testing may be performed on every block so that categorization is block specific. Testing may be directed to various qualities of tested memory cells including signal-to-noise ratio, data retention, endurance, and disturb aspects. Testing may provide better information regarding characteristics of different physical levels in a block than simply attempting to predict characteristics from known patterns and may be preferable where there is significant block-to-block and/or die-to-die variation. In general, because of memory hole geometry, error rates are higher in lower physical levels (closer to the substrate) and data densities for these levels are reduced accordingly. However, this may not always be the case and aspects of the present invention are applicable to various patterns of error rates. For example, where higher physical levels show higher error rates, higher physical levels may be programmed with a lower data density.

Figure 13:
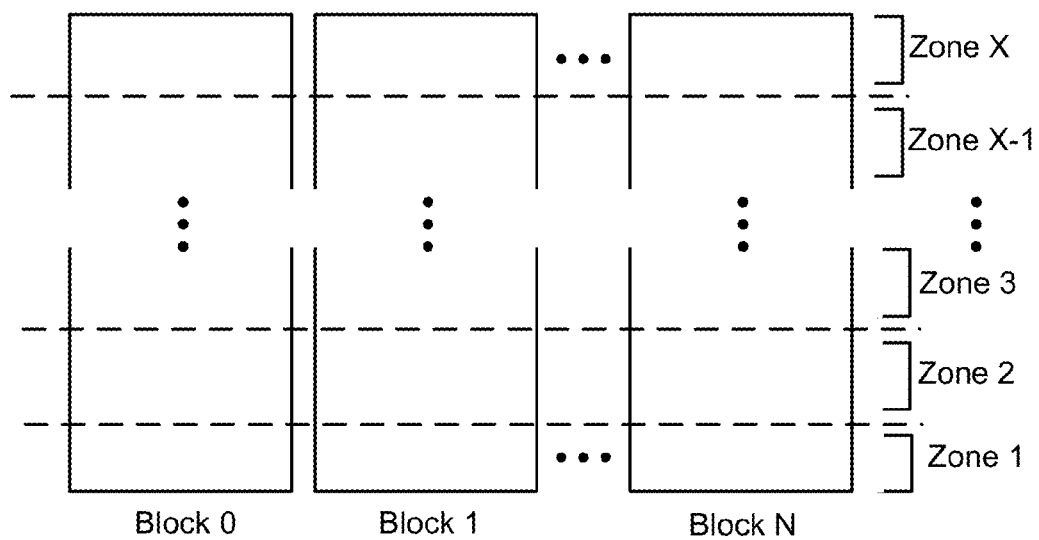
FIG. 13 shows an example of categorization of physical levels into X zones.

The number of zones used depends on the range of data densities and the number of physical levels. FIG. 13 shows X different zones 1 to X which store data with different data densities. X may be any number that is no greater than the number of physical levels. In some cases, one or more zones may store no user data. For example, if one or more physical levels are found to have an unacceptably high error rate even when they store only one bit per cell (SLC) then they may be marked as unusable and may not subsequently store user data. In some cases, memory cells in such levels may be considered as dummy cells and may be managed accordingly. For example, U.S. patent application Ser. No. 13/801,800, entitled, "Select transistor tuning," filed on Mar. 13, 2013, which is hereby incorporated by reference in its entirety, describes configuring dummy cells in three dimensional nonvolatile memories. In some cases, data in one or more physical level in a block may store a non-integer number of bits per cell. Thus, rather than having a one-to-one, two-to-one or other integer-to-one mapping of bits to cells, user data may be mapped to memory cells in a three-to-two, two-to-three, or other fractional (non-integer-to-one) mapping of bits to cells. Thus, the X zones shown in FIG. 13 do not necessarily mean that zone X stores X bits per cell. Zone 1 could store data using fractional mapping (e.g. two-to-three arrangement, with two bits for every three cells), zone two could store data in a different fractional mapping (e.g. four-to-three arrangement), and so on. Thus, increments in data density from zone to zone may be small (less than one-bit per cell increment) and data densities may be finely tailored to particular zones. In general, even physical levels with very poor characteristics (e.g. poor signal to noise ratios) are able to store data at some low density, which may be below one-bit per cell in some cases.

While many examples here show increases in data density with increasing height (increasing distance from substrate) this may not always be the case. Furthermore, categorization of physical levels does not always form contiguous zones. In some cases, a zone may be discontinuous with one or more physical levels of a different zone separating physical levels of the zone. Thus, physical levels that are categorized and zoned to store 3-bits per cell may be separated by one or more physical levels that are categorized and zoned to store 2-bits per cell.

Dynamic Adaptation

Categorization of physical levels into categories or zones may be static or dynamic. Static categorization may be based on some testing at initialization with the resulting categorization persisting throughout the life of the product. However, as memories age and experience wear (e.g. as a result of repeated write-erase cycles) their reliability may decrease. Thus, memory cells that are capable of reliably storing n-bits per cell at initialization may be unreliable for storage of n-bits per cell at some later time. However, such cells may still be capable of reliably storing n−1-bits per cell.

According to an aspect of the present invention, categorization may be performed at an appropriate time, not only at initialization, but may also be performed after some use. In some cases, physical levels may be recategorized at one or more times during the life of the product. For example, a physical level of memory cells in a block may initially be categorized to store n-bits per cell, may subsequently recategorized to store n−1 bits per cell, and may subsequently again be recategorized to store n−2 bits per cell. In some cases, physical levels are recategorized until a threshold number of physical levels are recategorized to store zero bits per cell (i.e. no longer used for storage of user data) at which point the block may be considered a bad block.

Figure 14:
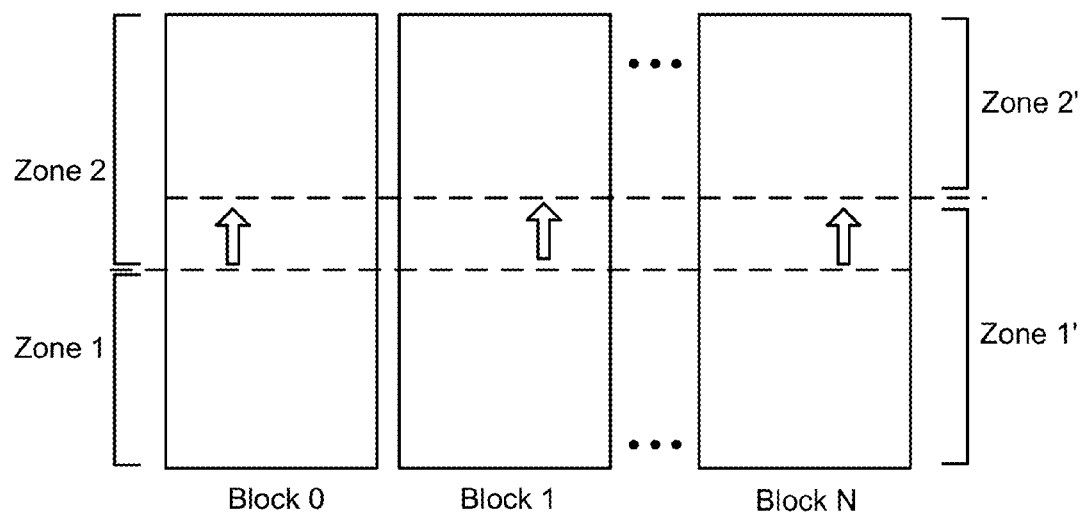
FIG. 14 shows an example of recategorization of physical levels.

FIG. 14 shows an example of recategorization of physical levels. Initial categorization of physical levels into zone 1 and zone 2 is shown on the left. Subsequently, as a result of direct testing or otherwise, one or more physical levels that were in zone 2 are recategorized into zone 1. Thus, the boundary between zone 1 and zone 2 moves up as shown, resulting in the modified zones 1' and 2' indicated on the right side. Similar boundary changes may occur where three or more zones are used.

FIG. 14 shows uniform recategorization across N blocks. Such uniform recategorization may be appropriate where blocks are known to have similar characteristics. For example, blocks on a particular die or in a particular plane may be known to be sufficiently similar so that such a uniform approach is appropriate. One or more sample block may be used to determine when recategorization is appropriate and which levels should be recategorized.

In some cases, a uniform approach to categorization and recategorization is not appropriate. For example, in some memories there is significant block-to-block variation so that while memory cells of a given physical level in one block can reliably store n-bits per cell, memory cells of the same physical level in another block cannot reliably store n-bits per cell. In this case, the memory cells of the same physical level in different blocks may be differently categorized according to testing performed on the blocks. Such testing generally allows a high degree of customization of data densities because data densities in a given physical level of a given block may be based on testing of that physical level in that block (rather than being based on some model). This block-by-block approach allows a very high degree of utilization of potential data storage capacity.

Figure 15:
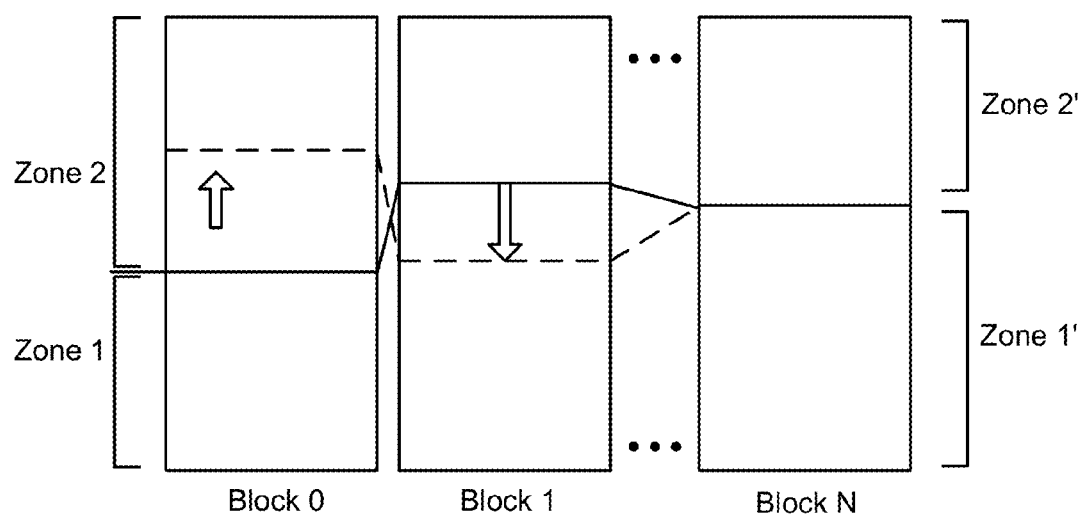
FIG. 15 shows another example of recategorization of physical levels.
Figure 19:
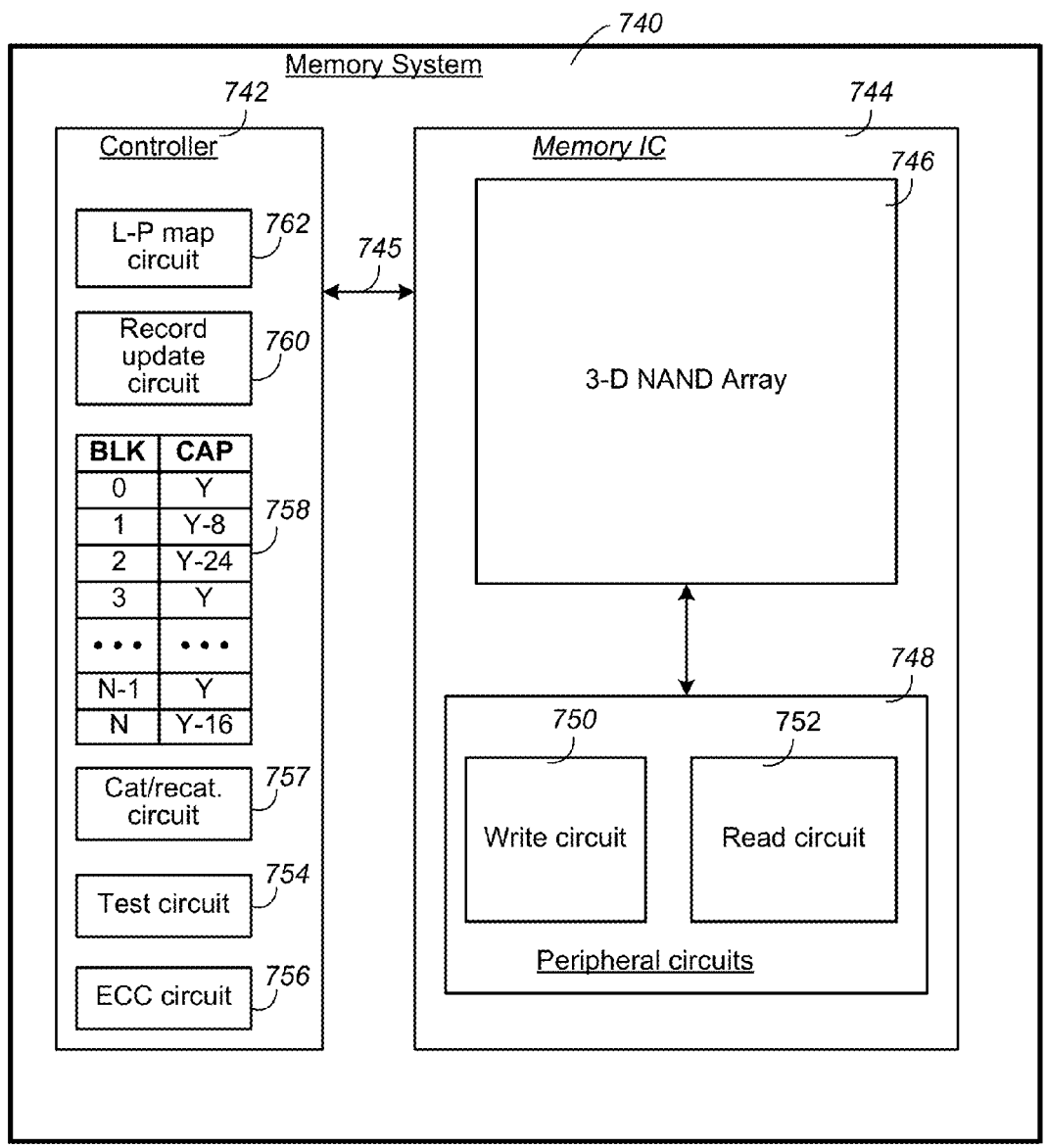
FIG. 19 shows an example of hardware with different data densities for different categories of physical levels.

FIG. 15 shows an example of categorization into zone 1 and zone 2 that is block specific as shown by the solid line extending across block 0-block N. This may be the result of block-by-block testing to categorize physical levels on a block-by-block basis. Subsequently, recategorization is performed on a block-by-block basis as shown by the modified boundary (dashed line). It can be seen that the modified boundary is higher in Block 0, indicating that some physical levels in Block 0 have been recategorized from zone 2 to zone 1. However, in block 1, the boundary has moved down indicating that one or more physical levels are recategorized from zone 1 to zone 2. In block N, the boundary remains the same as before so no physical levels are recategorized in this block.

Such a block-specific recategorization may be performed on a group of blocks at one time or may be performed on an individual block when some block-specific trigger occurs. For example, in some memory systems the number of write-erase cycles (hot count) is maintained for each block. When the hot count reaches a number that indicates significant use, the block may be tested and recategorization may be performed if testing indicates that it is appropriate. In other examples, increasing numbers of errors in user data read from a block, or from a portion of a block (identified by ECC or otherwise), may trigger testing and/or recategorization. For example, if the number of errors found in data from a particular physical level in a block exceeds a threshold number then the physical level may be recategorized to store a smaller number of bits per cell.

Variable Block Capacity

One consequence of an adapting storage density at different physical levels as described in the examples above is that the data storage capacity of different blocks may be different, and the data storage of any individual block may vary over time. Thus, rather than being a uniform static value, the data storage capacity of a block in such a memory is a non-uniform dynamic value. This variable block capacity has several consequences.

In general, where block capacity is non-uniform and dynamic, some system is needed to record the different capacities of different blocks across the memory system over time. And some system is needed to efficiently map user data to blocks of various capacities that change over time. Instead of dividing user data into fixed sized portions and mapping the portions to fixed sized blocks, user data must be mapped to blocks according to the data capacities of the blocks.

FIG. 16 shows a table that includes a separate entry for each of N+1 blocks (Block 0-Block N). In this example, a block is considered to have a maximum data capacity Y. This may be the data capacity of a good defect-free block at initialization. It can be seen that different blocks have some different capacities that are less than Y. Units of data capacity may be any suitable unit, for example, logical pages, sectors, or other units. In one example, the units may represent 1-bit per cell in one physical level of a block. Thus, a capacity of Y−3 could mean that three physical levels are storing one bit per cell less than their maximum capacity (e.g. three physical levels with a maximum data capacity of two bits per cell are categorized and mapped as storing one bit per cell). Alternatively, a capacity of Y−3 could mean that a single physical level stores three bits per cell less than its maximum (e.g. a physical level with a maximum data capacity of three bits per cell is categorized and mapped as storing zero bits per cell). It will be understood that the maximum capacity in such an example may not be a physical maximum but may depend on a number of factors including an ECC scheme used to encode and decode the data, a write scheme used to write the data to the memory, and a read scheme used to read the data.

In some cases, block data capacities may increase, for example as a result of some improvement in memory operation. A new write scheme, read scheme, or other change in memory operation may allow higher data density in blocks of a memory array. When a new memory design is first implemented, various memory operations may not be optimized for the new design and block capacities may reflect this in relatively low data densities. Subsequently, when such operations are better optimized, it may be possible to reliably store more bits per cell in a given physical level of a given block. Block data capacities may be updated accordingly to reflect increased data capacity. For example, if memory parameters are adjusted as blocks age ("dynamic TRIMing") in order to improve retention margins between states then slower, fine programming may allow higher data density (by sacrificing some performance). Thus, data density in a given physical level may be the result of various parameter choices which may depend on requirements for a particular application. A memory controller that implements aspects of the present invention may be adaptive to a range of different memory dies so that as technology changes rapidly, such a memory controller adapts itself and does not need to be replaced with each new generation.

FIG. 17 illustrates an example of zone based data density. Physical levels are categorized into zones 715. This may be done block-by-block or for some group of blocks. An appropriate data density is selected and applied to each zone 717 (i.e. an appropriate number of bits per cell is used in each zone). Data capacity of a block may be calculated from the aggregate of the data capacities of the physical levels in the block 719, depending on how many bits are stored per cell in those physical levels. The data capacities of the blocks are recorded 721 (for example in a table as shown in FIG. 16). Subsequently, user data is mapped to the blocks according to their recorded data capacities in order to efficiently use space in the blocks 723.

FIG. 18 illustrates recategorization of physical levels after a block has been in use for some period. A triggering event occurs 831, such as a high error rate in data read from the block, hot count reaching a predetermined value, or some other trigger. Then one or more physical levels are tested 833. Testing may be limited to a particular physical level, for example because data read from that physical level has a high error rate. In other cases, multiple physical levels, or all physical levels in the block are tested. Then, one or more physical levels may be recategorized according to test results 835. If any recategorization occurs then the new capacity of the block is determined 837 and the new capacity is recorded 839. Subsequently, when user data is to be written to the block, the updated capacity is used to determine how much user data can be stored 841.

FIG. 17 illustrates an example of hardware that may be used to implement aspects of the present invention. In particular, FIG. 17 shows memory system 740 which includes a memory controller 742 and a memory die or Integrated Circuit (IC) 744 connected by a bus 745. It will be understood that additional memory ICs may be connected to memory controller 742 by bus 745, and/or by additional busses. Memory IC 744 includes a three-dimensional nonvolatile NAND memory array 746 that is monolithically formed in two or more physical levels of memory cells disposed above a substrate. The physical levels are categorized into zones that store different numbers of bits per cell. Memory IC 744 also includes peripheral circuits 748, including write circuit 750 and read circuit 752. Memory controller 742 includes test circuit 754 and ECC circuit 756. Test circuit 754 may test memory cells of a particular physical level to determine how many bits per cell can be stored in memory cells of the particular physical level. This may include writing and reading data from the memory cells under particular test conditions using write circuit 750 and read circuit 752. This testing may use ECC circuit 756 and/or other circuits to identify error rates. Categorization/recategorization circuit 757 then categorizes physical levels according to the results obtained by test circuit 754. Table 758 records block data capacities for blocks in 3-D NAND Array 746 based on the data densities identified for each zone. A record update circuit 760 updates block data capacities throughout the life of the memory product so that as blocks experience wear, and test circuit 754 recategorizes physical levels accordingly, updated block data capacities are recorded. A logical-to-physical mapping circuit 762 maps user data to blocks in 3-D NAND array 746 according to block data capacities recorded in table 758. It will be understood that this hardware is an example and that aspects of the present invention may be implemented using different hardware.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating a three-dimensional nonvolatile memory system in which an individual memory die is monolithically formed in a plurality of physical layers of memory cells disposed above a substrate, comprising:
   configuring a plurality of blocks in the three-dimensional nonvolatile memory so that, in an individual block of the plurality of blocks, the individual memory block contains memory cells in a first category of physical layers that store a first number of bits per cell and memory cells in a second category of physical layers that store a second number of bits per cell, the second number being greater than the first number;
   recording data capacity values for the plurality of blocks based on the numbers of physical layers in the first and second categories in the blocks; and
   subsequently, mapping portions of user data to the plurality of blocks according to data capacities of the blocks.

2. The method of claim 1 wherein different blocks of the plurality of blocks have different data capacities and a separate data capacity value is recorded for each of the plurality of blocks.

3. The method of claim 1 further comprising subsequently reconfiguring at least one block of the plurality of blocks so that at least one physical layer in the at least one block is recategorized between first and second categories and the number of bits per cell stored in the at least one physical layer is changed.

4. The method of claim 3 wherein the reconfiguring includes recategorizing at least one physical layer in the at least one block that previously stored at least one bit per cell as a bad physical layer that is not for subsequent storage of user data.

5. The method of claim 3 further comprising recording a new data capacity value for the at least one block, the new data capacity reflecting the changed number of bits per cell stored in the at least one physical layer of the block, and subsequently mapping user data to the at least one block according to the new data capacity.

6. The method of claim 5 wherein the at least one physical layer is recategorized from the second category to the first category thereby reducing the number of bits per cell stored in the at least one physical layer resulting in the new data capacity value for the at least one block being less than a previous data capacity value for the at least one block, and wherein subsequent to the reconfiguring less user data is mapped to the at least one block than was mapped to the at least one block prior to the reconfiguring.

7. The method of claim 6 wherein the reconfiguring occurs in response to at least one of: a number of write erase cycles experienced by the at least one block exceeding a threshold number, or an error rate of data read from the at least one block exceeding a threshold number.

8. The method of claim 1 wherein either: (a) the first number of bits per cell is one and the second number of bits per cell is two, or (b) the first number of bits per cell is two and the second number of bits per cell is three.

9. The method of claim 1 wherein memory cells of a third category of physical layers in the individual block store a third number of bits per cell, and the recorded data capacity value for the blocks is based on the numbers of physical layers in the first, second, and third categories.

10. The method of claim 9 wherein the first number of bits per cell is one, the second number of bits per cell is two, and the third number of bits per cell is three.

11. The method of claim 1 wherein memory cells of a third category of physical layers in the individual block are configured to store no user data.

12. A three-dimensional nonvolatile memory system comprising:
- a three-dimensional nonvolatile memory that is monolithically formed in a plurality of physical layers of memory cells disposed above a substrate;
- a plurality of individually erasable blocks in the three-dimensional nonvolatile memory, each of the plurality of individually erasable blocks extending through the plurality of physical layers;
- a write circuit that is configured to write data along word lines of a first category of physical layers in an individual block by writing a first number of bits per cell and to write data along word lines of a second category of physical layers in the individual block by writing a second number of bits per cell, the second number being greater than the first number;
- a block capacity record that records block data capacities of the plurality of individually erasable blocks; and
- a logical to physical mapping circuit that maps portions of user data to the plurality of individually erasable blocks according to their recorded capacities.

13. The three-dimensional nonvolatile memory system of claim 12 wherein different blocks of the plurality of blocks have different data capacities and the block capacity record contains an entry for each of the plurality of blocks.

14. The three-dimensional nonvolatile memory system of claim 12 wherein the write circuit is located on the substrate, and the block capacity record and the logical to physical mapping circuit are located in a memory controller on a separate substrate.

15. The three-dimensional nonvolatile memory system of claim 14 wherein the memory controller is connected to the three-dimensional nonvolatile memory and the memory controller is connected to additional three-dimensional nonvolatile memories that are disposed above additional substrates.

16. The three-dimensional nonvolatile memory system of claim 15 wherein the block capacity record records capacities of individually erasable blocks in the additional three-dimensional nonvolatile memories and the logical to physical mapping circuit maps portions of user data to the individually erasable blocks in the additional three-dimensional nonvolatile memories according to their recorded capacities.

17. The three-dimensional nonvolatile memory system of claim 16 further comprising a recategorization circuit located in the memory controller, the recategorization circuit configured to recategorize physical layers between the first and second categories in the plurality of individually erasable blocks in the three-dimensional nonvolatile memory and the individually erasable blocks in the additional three-dimensional nonvolatile memories, thereby changing corresponding block data capacities.

18. The three-dimensional nonvolatile memory system of claim 17 further comprising: an Error Correction Code (ECC) circuit in communication with the recategorization circuit, the ECC circuit configured to determine a number of bad bits in a portion of data in an individual block, the recategorization circuit configured to recategorize physical layers of the individual block in response to the number of bad bits in the portion of data exceeding a threshold number.

19. The three-dimensional nonvolatile memory system of claim 12 wherein either: (a) the first number of bits per cell is one and the second number of bits per cell is two, or (b) the first number of bits per cell is two and the second number of bits per cell is three.

20. The three-dimensional nonvolatile memory system of claim 12 wherein the write circuit is further configured to write data along word lines of a third category of physical layers in the individual block by writing a third number of bits per cell, and the recorded block data capacities for the blocks are based on the numbers of physical layers in the first, second, and third categories in corresponding blocks.

21. The three-dimensional nonvolatile memory system of claim 20 wherein the first number of bits per cell is one, the second number of bits per cell is two, and the third number of bits per cell is three.

22. A method of operating a three-dimensional nonvolatile memory system in which an individual memory die is monolithically formed in a plurality of physical layers of memory cells disposed above a substrate, comprising:
- configuring a plurality of blocks in the three-dimensional nonvolatile memory so that, in an individual block of the plurality of blocks, the individual block contains memory cells in a first category of physical layers that store a first number of bits per cell and memory cells in a second category of physical layers that store a second number of bits per cell, the second number being greater than the first number;
- recording individual data capacity values for each of the plurality of blocks based on the numbers of physical layers in the first and second categories in the blocks;
- subsequently, mapping portions of user data to the plurality of blocks according to individual data capacity values of the blocks;
- subsequently reconfiguring at least one block of the plurality of blocks so that at least one physical layer in the at least one block is recategorized between first and second categories and the number of bits per cell stored in the at least one physical layer is changed;
- recording a new data capacity value for the at least one block, the new data capacity value reflecting the changed number of bits per cell stored in the at least one physical layer of the block;
- and subsequently mapping portions of user data to the at least one block according to the new data capacity value.

23. A three-dimensional nonvolatile memory system comprising:
- a three-dimensional nonvolatile memory that is monolithically formed in a plurality of physical layers of memory cells disposed above a substrate;
- a plurality of individually erasable blocks in the three-dimensional nonvolatile memory, each of the plurality of individually erasable blocks extending through the plurality of physical layers;
- a write circuit that is configured to write data along word lines of a first category of physical layers in an individual block by writing a first number of bits per cell and to write data along word lines of second category of physical layers in the individual block by writing a second number of bits per cell, the second number being greater than the first number;
- a block capacity record that records individual block data capacity values for each of the plurality of individually erasable blocks;
- a logical to physical mapping circuit that maps portions of user data to the plurality of individually erasable blocks according to their recorded capacities; and
- a recategorization circuit located in the memory controller, the recategorization circuit configured to recategorize physical layers between the first and second categories in the plurality of individually erasable blocks in the three-dimensional nonvolatile memory thereby changing corresponding block data capacities of the plurality of individually erasable blocks.

* * * * *